United States Patent
Toribatake et al.

(10) Patent No.: US 9,960,317 B2
(45) Date of Patent: May 1, 2018

(54) METHOD FOR MANUFACTURING DISPLAY DEVICE

(71) Applicant: Japan Display Inc., Minato-ku (JP)

(72) Inventors: Kenji Toribatake, Minato-ku (JP); Kazufumi Watabe, Minato-ku (JP)

(73) Assignee: Japan Display Inc., Minato-ku (JP)

(*) Notice: Subject to any disclaimer, the term of this patent is extended or adjusted under 35 U.S.C. 154(b) by 0 days. days.

(21) Appl. No.: 15/630,243

(22) Filed: Jun. 22, 2017

(65) Prior Publication Data
US 2018/0062026 A1 Mar. 1, 2018

(30) Foreign Application Priority Data
Aug. 26, 2016 (JP) .................................. 2016-165669

(51) Int. Cl.
*H01L 33/52* (2010.01)
*H01L 23/544* (2006.01)
*H01L 33/00* (2010.01)

(52) U.S. Cl.
CPC ........ *H01L 33/0095* (2013.01); *H01L 23/544* (2013.01); *H01L 33/52* (2013.01); *H01L 2223/54426* (2013.01)

(58) Field of Classification Search
CPC .... H01L 33/0095; H01L 23/544; H01L 33/52
See application file for complete search history.

(56) References Cited

U.S. PATENT DOCUMENTS

| 2005/0186760 A1* | 8/2005 | Hashimura | B23K 26/18 438/460 |
| 2015/0187807 A1* | 7/2015 | Tsuruoka | H01L 27/124 257/347 |
| 2016/0322452 A1 | 11/2016 | Tsuruoka et al. | |

FOREIGN PATENT DOCUMENTS

JP  2015-125295  7/2015

* cited by examiner

*Primary Examiner* — Karen Kusumakar
(74) *Attorney, Agent, or Firm* — Oblon, McClelland, Maier & Neustadt, L.L.P.

(57) ABSTRACT

A lamination includes a sheet substrate and a display element layer. The sheet substrate includes a plurality of product regions cut out into a plurality of products and a blank region surrounding the product regions. The display element layer is formed on each of a plurality of display areas placed on each of the plurality of product regions for displaying an image. The sheet substrate adheres to a top of a substrate. The substrate has light transmissivity. A protective film is adhered to the lamination so as to cover the display areas. A divider line is formed in a blank region that surrounds the product regions by removing a portion of the lamination. The substrate is removed from the sheet substrate by irradiating the sheet substrate with a laser beam.

6 Claims, 22 Drawing Sheets

METHOD FOR MANUFACTURING DISPLAY DEVICE

CROSS-REFERENCE TO RELATED APPLICATION

The present application claims priority from Japanese application JP2016-165669 filed on Aug. 26, 2016, the content of which is hereby incorporated by reference into this application.

BACKGROUND OF THE INVENTION

1. Field of the Invention

The present invention relates to a method for manufacturing a display device.

2. Description of the Related Art

JP2015-125295A discloses a manufacturing process of a flexible display device. In this manufacturing process, a flexible sheet substrate (substrate 2 in JP2015-125295A) and a display element layer are formed on a substrate (glass substrate 10 in JP2015-125295A) having light transmissivity and of a size to include a plurality of display devices in a plan view. Each display device is formed by removing the substrate from the sheet substrate and cutting the sheet substrate for each product region of the display devices.

SUMMARY OF THE INVENTION

Regarding the manufacturing process of the display device, the inventors consider removing the substrate from the sheet substrate by irradiating the substrate with laser beams to alter the surface of the sheet substrate in contact with the substrate by heat. In this regard, the laser beams are diffused on the edges of the substrate, and thus adhesion between the substrate and the sheet substrate is maintained in the edges, which cases damage to the sheet substrate when the substrate is removed. As such, before the substrate is separated from the sheet substrate, a divider line, which is a cut formed by removing a portion of the sheet substrate, is formed in a shape to surround the area of the display device. A portion where the adhesion between the sheet substrate and the substrate is maintained is thus cut off, and the sheet substrate can be prevented from being damaged when the substrate is removed.

For example, the divider line can be formed by irradiating the sheet substrate with laser beams and removing the sheet substrate altered by heat of the laser beams as a foreign substance. However, if the foreign substance generated by the laser irradiation is adhered to the sheet substrate, it is difficult to remove the foreign substance by washing. As such, before the divider line is formed on the sheet substrate, a protective film needs to be adhered to the sheet substrate to cover the sheet substrate.

Here, if the protective film is adhered to the sheet substrate so as to cover the entire sheet substrate, the laser beams are not directly irradiated to the sheet substrate. It is thus difficult to form a divider line on the sheet substrate at the estimated depth. In addition, if protective films are adhered to respective display devices, the number of protective films needed to be adhered is increased.

One or more embodiments of the present invention have been conceived in view of the above, and an object thereof is to prevent a sheet substrate from being damaged and a foreign substance from being remained in a manufacturing process of a display device, and to provide convenience of manufacturing the display device.

A method for manufacturing a display device according an aspect of the present invention includes a preparing step of preparing a lamination that includes a sheet substrate and a display element layer, the sheet substrate including a plurality of product regions cut out into a plurality of products and a blank region surrounding the product regions, the display element layer formed on each of a plurality of display areas placed on each of the plurality of product regions for displaying an image, the sheet substrate being adhere to a top of a substrate, and the substrate having light transmissivity, an adhering step of adhering a protective film on the lamination so as to cover the display areas, a dividing step of forming, after the adhering step, a divider line by removing a portion of the blank region of the lamination, an irradiating step of irradiating, after the dividing step, the sheet substrate with a laser beam from a side of the substrate that is not in contact with the sheet substrate, and a removing step of removing the substrate from the sheet substrate after the irradiating step. This configuration can prevent the sheet substrate from being damaged and a foreign substance from being remained, and also provide convenience of manufacturing the display device.

DETAILED DESCRIPTION OF THE INVENTION

Figure 1:
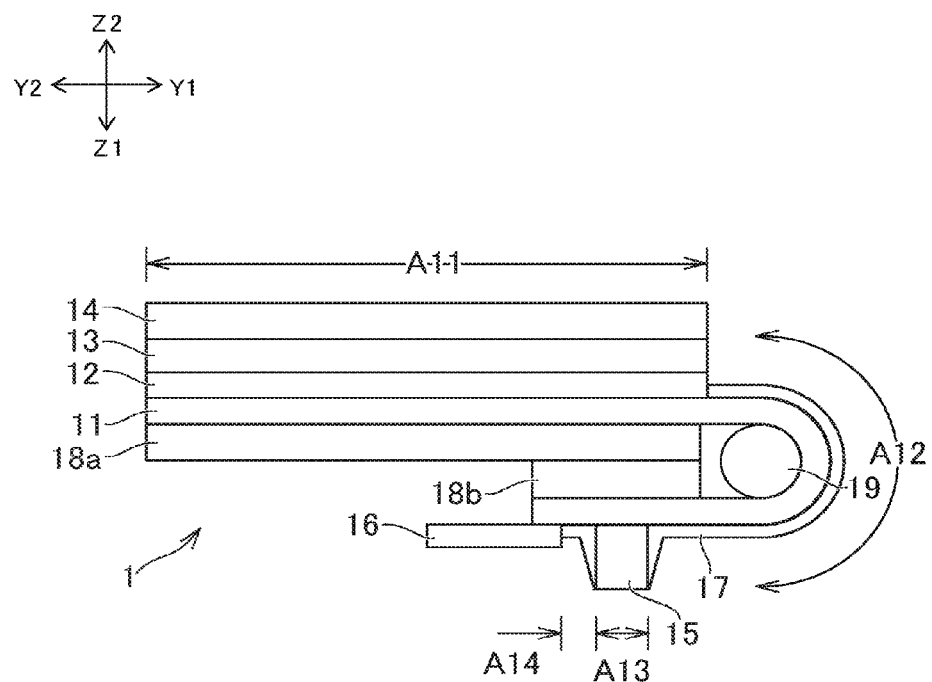
FIG. 1 is a schematic cross-sectional view of a display device 1 according to the embodiment.

Embodiments of the present invention will be de scribed below in detail. In this regard, the embodiments disclosed in the present specification are just examples of the present disclosure, and any modifications of the present disclosure easily devised by a person skilled in the art fall within the scope of the claims. Further, the widths, thicknesses, shapes, or other characteristics of each part in the drawings are schematically illustrated for clarity of illustration compared to actual configurations, and should not be understood to limit the interpretation of the present disclosure. In the present specification and drawings, some elements identical or similar to those shown previously are denoted by the same reference signs as the previously shown elements, and thus repetitive detailed descriptions of them may be omitted as appropriate.

Further, in the embodiments, if not otherwise stated, the words "on" and "below" suggest not only a case where a component is disposed immediately on or below another component, but also a case where the component is disposed on or below the another component with a third component interposed therebetween.

FIG. 1 is a schematic cross-sectional view of a display device 1 according to this embodiment. FIGS. 2 to 11 are diagrams explaining manufacturing processes of the display device 1. In the following, a positional relationship between elements will be explained by using X-axis (X1 direction, X2 direction), Y-axis (Y1 direction, Y2 direction), and Z-axis (Z1 direction, Z2 direction) coordinates.

[1. Configuration of Display Device]

As shown in FIG. 1, the display device 1 according to this embodiment includes a display area A11 for displaying an image, a curved area A12, a first terminal area A13 to which an integrated circuit (IC) 15 is mounted, and a second terminal area A14 to which a flexible printed circuit (FPC) 16 is mounted. The display device 1 is curved in the curved area A12 along the curve of the surface of a spacer 19. This configuration enables to apparently narrow an outer area of the display area A11 and hide the IC 15 and the FPC 16 in the back of the display device.

The display device 1 includes a first lamination 11. The first lamination 11 includes a flexible sheet substrate and a display element layer for displaying an image. The sheet substrate is formed of a resin material, such as a polyimide. The display element layer is formed on the sheet substrate (more specifically, on the Z2 direction side), and covers at least the display area A11. The display element layer includes, for example, a thin film transistor (TFT), a lower electrode electrically connected to the TFT, an upper electrode formed on the lower electrode, and an organic layer formed between the lower electrode and the upper electrode. The organic layer includes at least a light-emitting layer, and may further include at least one of an electron transport layer, a hole transport layer, an electron injection layer, and a hole injection layer. The first lamination 11 includes first and second terminal areas A13 and A14 in which a wiring layer is formed. The wiring layer is electrically connected to an electrode (e.g., electrode of TFT) included in the display element layer.

The display device 1 includes a second lamination 12. The second lamination 12 is formed on the first lamination 11, and covers the display area A11 in a plan view. The second lamination 12 is formed of a resin material, such as a polyimide, and includes a flexible counter sheet substrate. The second lamination 12 may include a color filter layer that transmits light in a predetermined wavelength, and an overcoat layer that prevents diffusion of dye contained in the color filter layer. Further, a transparent filler may be provided between the first lamination 11 and the second lamination 12.

A protective film 13 is adhered to the second lamination 12, and a polarizing plate 14 is adhered to the protective film 13. The protective film 13 and the polarizing plate 14 cover the display area A11. Further, backing films 18a and 18b are adhered to the first lamination 11. The backing films 18a and 18b may be a film with a hole or a notch, or formed of a plurality of films. The protective film 13 and the backing films 18a and 18b may be formed of PET as a material, for example, and adhered through a double-sided adhesive sheet (not shown). Alternatively, surfaces of the protective film 13 and the backing films 18a and 18b may be applied with adhesive for adhesion.

[2. Manufacturing Method of Display Device]

A manufacturing method of the display device 1 according to this embodiment will be described. The manufacturing process of the display device 1 includes a step of preparing a manufacturing substrate 100, which is a structure including the display device 1, a first dividing step of forming first divider lines L11 to L14 on the manufacturing substrate 100, a first irradiating step of irradiating a counter substrate 30 stuck to a second lamination 12 with light, a first removing step of removing the counter substrate 30 from the second lamination 12, a cutting step of cutting the second lamination 12 at least in the first terminal area A13 and the second terminal area A14, a protective film adhering step of adhering a protective film 13 to the second lamination 12, a second dividing step of forming second divider lines L21 to L24 on the manufacturing substrate 100, a cleaning step of cleaning the manufacturing substrate 100, an exposing step of exposing the wiring layer from the first lamination 11, a first cutting step of cutting the manufacturing substrate 100 so as to include a group of product regions A1, a polarizing plate adhering step of adhering a polarizing plate 14 on the protective film 13, an attaching step of attaching the IC 15 and the FPC 16, a second irradiating step of irradiating the substrate 20 stuck to the first lamination 11 with light, a second removing step of removing the substrate 20 from the first lamination 11, a backing film adhering step of adhering backing films 18a and 18b to the first lamination 11, an autoclaving step of applying heat and pressure to the manufacturing substrate 100, a second cutting step of cutting the manufacturing substrate 100 along the product regions A1 for individual display devices 1, and a curving step of curving the display device 1 along the spacer 19.

[2-1. Configuration of Manufacturing Substrate]

Figure 2:
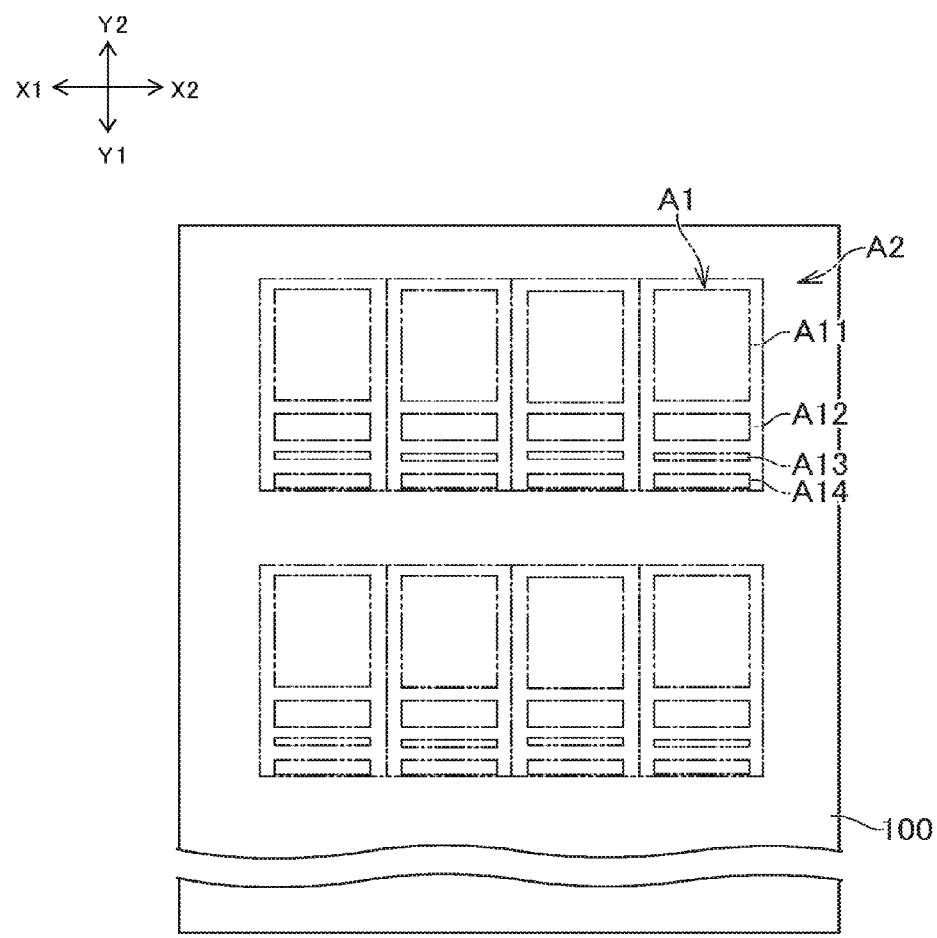
FIG. 2 is a schematic top view of a manufacturing substrate according to the embodiment.

The manufacturing process of the display device 1 according to this embodiment first prepares a manufacturing substrate 100, which is a substrate to form a plurality of display devices 1. As shown in FIG. 2, the manufacturing substrate 100 includes a plurality of product regions A1 to be cut into products, and a blank region A2 that surrounds the product regions A1. The product regions A1 are arranged to be adjacent to one another in the X-axis direction. In the following, the product regions A1 thus arranged to be adjacent to one another are also referred to as a group of product regions A1. In this embodiment, the manufacturing substrate 100 includes groups of product regions A1, which are arranged at intervals in the Y-axis direction.

Each product region A1 includes a display area A11, a curved area A12, a first terminal area A13, and a second terminal area A14. The display area A11, the curved area A12, the first terminal area A13, and the second terminal area A14 are formed at positions that do not overlap one another in the Y-axis direction. In this embodiment, the display areas A11 included in the groups of product regions A1 are arranged adjacent to one another in the X-axis direction such that the first and second terminal areas A12 and A13 are not inserted between the display areas A11. In other words, the product regions A1 including the groups of product regions A1 are arranged adjacent to one another in a direction in which the display areas A11 are arranged in the groups of product regions A1.

Figure 3:
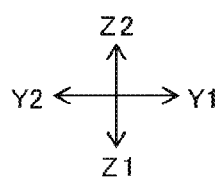
FIG. 3 is a schematic cross-sectional view of the manufacturing substrate.
Figure 3:
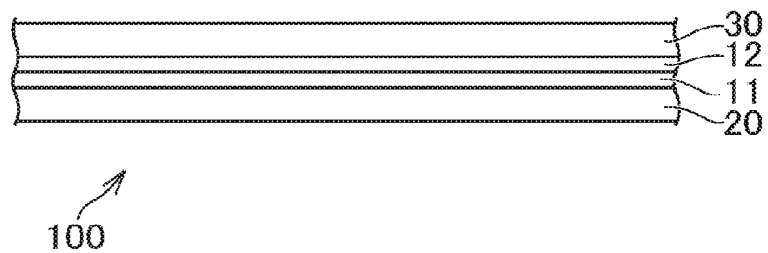

As shown in FIGS. 2 and 3, the manufacturing substrate 100 includes a substrate 20 having light transmissivity, a first lamination 11, a second lamination 12, and a counter substrate 30 having light transmissivity similarly to the substrate 20. The first lamination 11 includes a flexible sheet substrate stuck to the substrate 20 and a display element layer formed on the display areas A11 for displaying an image. The display areas A11 are formed on the product regions A1 respectively. The second lamination includes a counter sheet substrate stuck to the counter substrate 30. The substrate 20 and the counter substrate 30 may be transparent glass substrates, for example. The first lamination 11 is disposed on the substrate 20 (in the Z2 direction side), and the second lamination 12 is disposed under the counter substrate 30 (in the Z1 direction side). The first lamination 11 may be adhered to the second lamination 12 in the product region A1 by using a transparent filler. In this case, the filler may not be put on the blank region A2.

[2-2. First Dividing Step]

Figure 4:
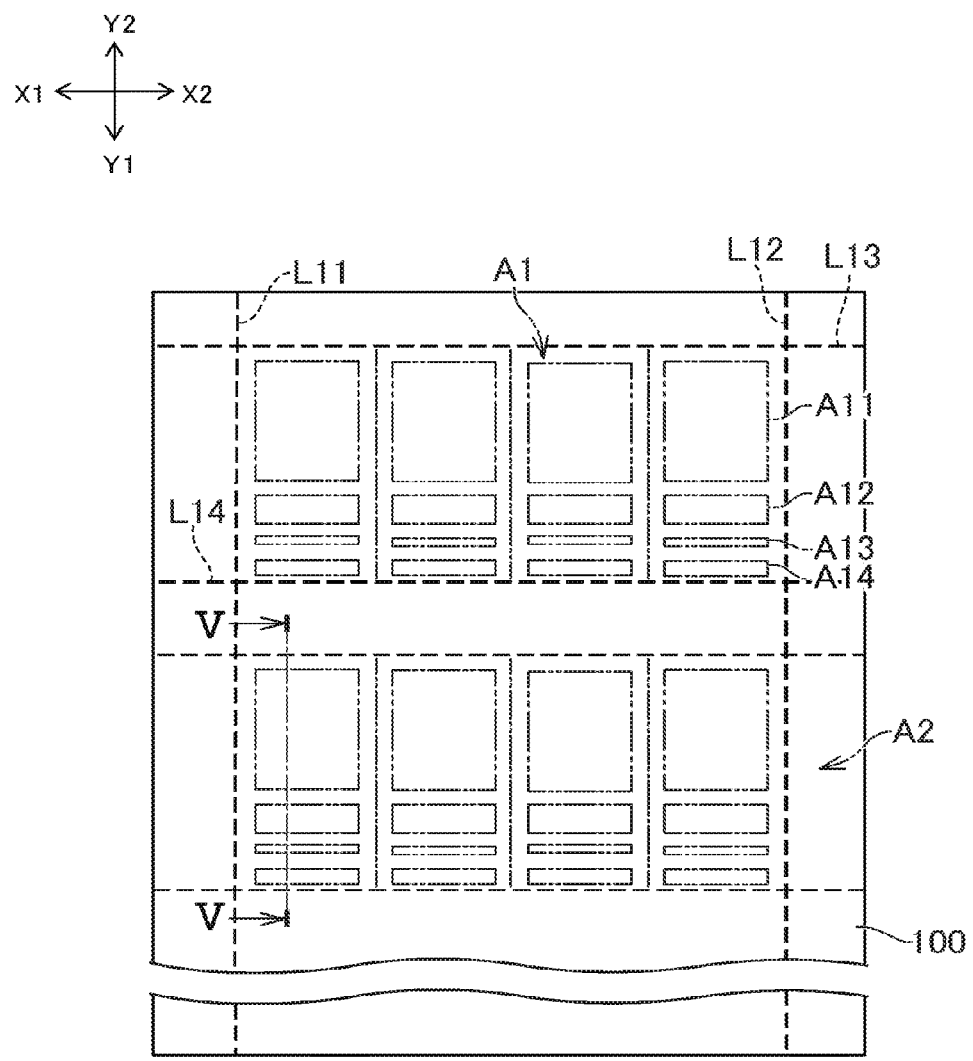
FIG. 4 is a top view of the manufacturing substrate illustrating a step of forming a first divider line on the manufacturing substrate.
Figure 5A:
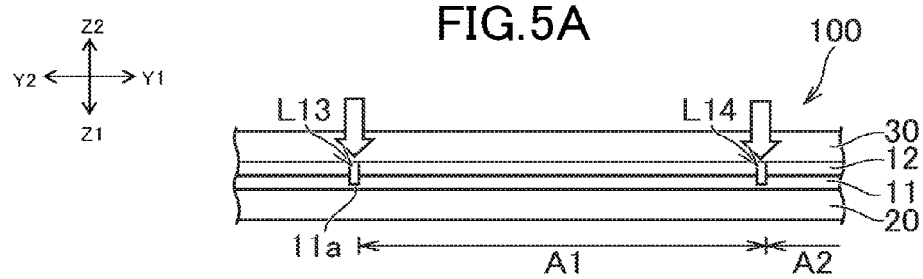
FIG. 5A is a cross-sectional view of the manufacturing substrate illustrating a step of forming a first divider line.

Subsequently, as shown in FIGS. 4 and 5A, first divider lines L11 to L14 are formed by linearly removing portions of the second lamination 12 at positions that do not overlap the product regions A1. In this embodiment, the first divider lines L11 to L14 are formed along the boundaries between the groups of product regions A1 and the blank region A2 outside the groups of product regions A1. Specifically, there are formed the first divider line L11 extending along the boundary in the X1 direction side, the first divider line L12 extending along the boundary in the X2 direction side, the first divider line L13 extending along the boundary in the Y2 direction side, and the first divider line L14 extending along the boundary in the Y1 direction side. In the example shown in FIG. 4, the first divider lines L11 and L13 are sequentially formed in the Y-axis direction, although the first divider lines L11 and L13 may be disconnected in the blank region A2 if the first divider lines L11 and L13 are connected to the first divider lines L12 and L14.

In this embodiment, the first divider lines L11 to L14 are formed by irradiating the second lamination 12 with laser beams through the counter substrate 30. The first divider lines L11 to L14 are formed not only on the second lamination 12 but also on the first lamination 11. In this regard, since the first lamination 11 is irradiated with laser beams through the counter substrate 30, there may remain the first lamination 11 that are not removed (hereinafter referred to as remainder 11a) from the position in the first divider lines L11 to L14 in the Z1 direction side.

[2-3. First Irradiating Step]

Figure 5B:
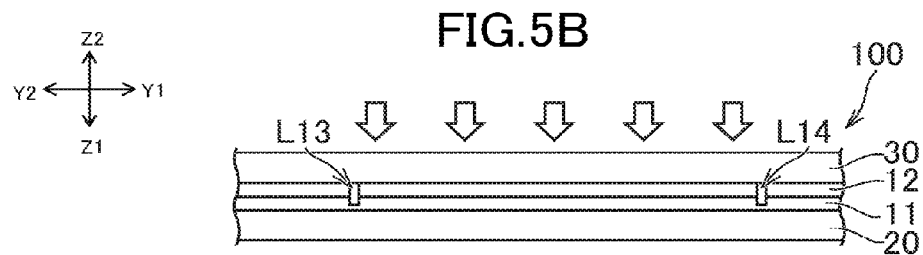
FIG. 5B is a cross-sectional view of the manufacturing substrate illustrating a step of irradiating the manufacturing substrate with laser beams.

Subsequently, as shown in FIG. 5B, the second lamination 12 is irradiated with laser beams through the counter substrate 30. Then, heat is applied to a surface of the counter sheet substrate stuck to the counter substrate 30, and ablation (destruction) occurs on the surface due to heating. This reduces adhesion between the counter substrate 30 and the counter sheet substrate, and the counter substrate 30 is thereby strippable from the counter sheet substrate.

In a case where the filler for bonding the first lamination 11 and the second lamination 12 is provided only on the product region A1 and not on the blank region A2, adhesion between the counter substrate 30 and the counter sheet substrate may be maintained in an area that is included in the blank region A2 and is outside the area bounded by the first divider lines L11 to L14. In this case, laser beams may be irradiated such that at least the area bounded by the first divider lines L11 to L14 is thoroughly irradiated. The laser beams are not diffused in the area bounded by the first divider lines L11 to L14, and thus, it is possible not to maintain the adhesion between the counter substrate 30 and the counter sheet substrate in such an area.

[2-4. First Removing Step]

Figure 5C:
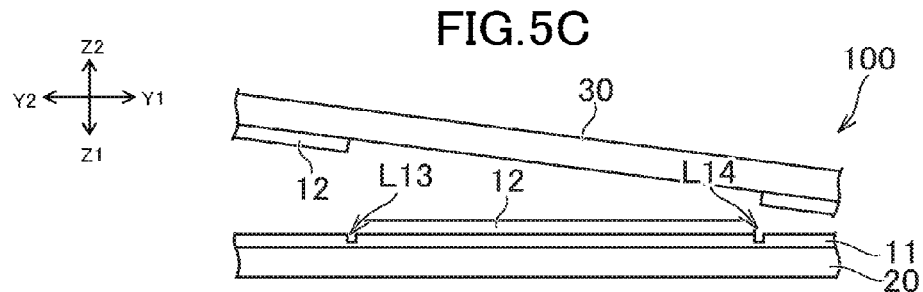
FIG. 5C is a cross-sectional view of the manufacturing substrate illustrating a step of removing the counter substrate from the manufacturing substrate.

Subsequently, as shown in FIG. 5C, the counter substrate 30 is removed from the counter sheet substrate included in the second lamination 12. As discussed above, the first divider lines L11 to L14 are formed on the second lamination 12, and the adhesion between the counter substrate 30 and the counter sheet substrate included in the second lamination 12 is reduced at least in the area bounded by the first divider lines L11 to L14. As such, the counter substrate 30 can be removed without damaging the counter sheet substrate. In a case where the adhesion between the counter substrate 30 and the counter sheet substrate is maintained in an area outside the area bounded by the first divider lines L11 to L14, the second lamination 12 in the outside area is removed from the manufacturing substrate 100 together with the counter substrate 30.

[2-5. Cutting Step]

Figure 5D:
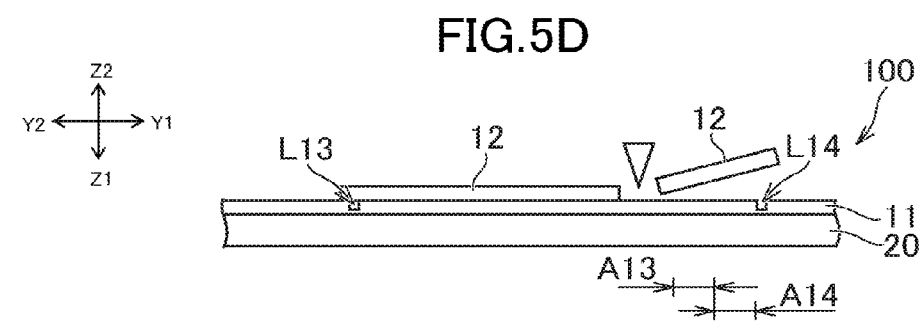
FIG. 5D is a cross-sectional view of the manufacturing substrate illustrating a step of cutting off a second lamination from the manufacturing substrate.

Subsequently, as shown in FIG. 5D, the second lamination 12 is cut off in the curved area A12, the first terminal area A13, and the second terminal area A14. The second lamination 12 may be cut off by using, for example, a mechanical cutter.

[2-6. Protective Film Adhering Step]

Figure 6:
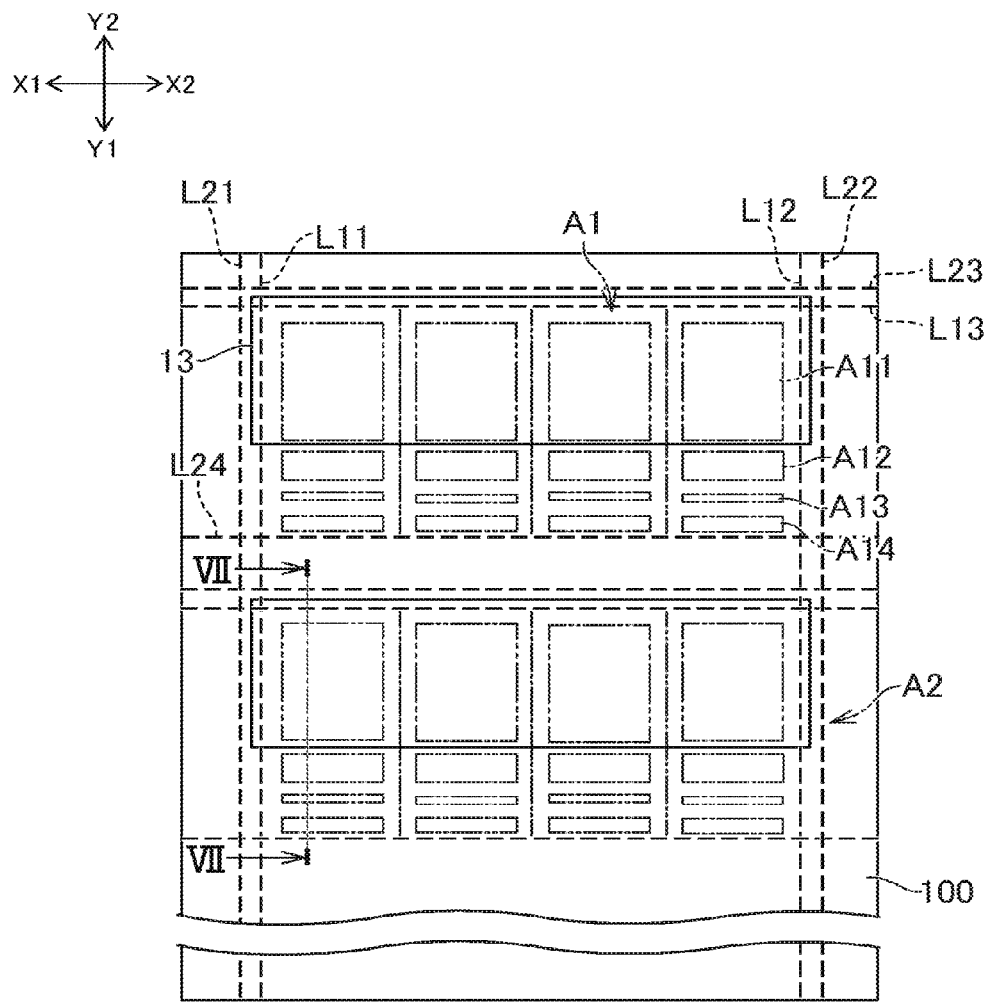
FIG. 6 is a top view of the manufacturing substrate illustrating a step of adhering a protective film to the manufacturing substrate and forming a second divider line.
Figure 7A:
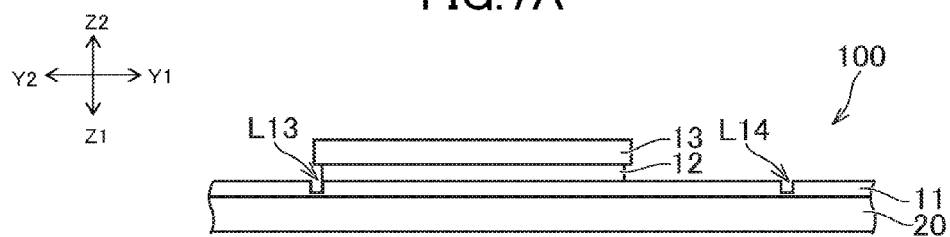
FIG. 7A is a cross-sectional view of the manufacturing substrate illustrating a step of adhering a protective film to the manufacturing substrate.

As shown in FIGS. 6 and 7A, the protective film 13 is then adhered to the first lamination 11. The protective film 13 is adhered so as to cover the display areas A11 respectively provided in the product regions A1. The protective film 13 covers a part of the blank region A2. Specifically, the protective film 13 extends to a part of the blank region A2 across the boundaries of the group of product regions A1 in the X1 direction side, the X2 direction side, and the Y2 direction side. However, the protective film 13 does not cover the curved area A12, the first terminal area A13, and the second terminal area A14. In the example shown in FIG. 6, a protective film 13 is adhered to each group of product regions A1, and covers display areas A11 in each group of product regions A1.

[2-7. Second Dividing Step]

Figure 7B:
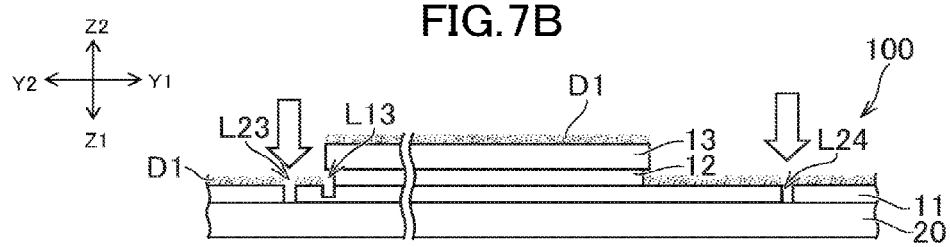
FIG. 7B is a cross-sectional view of the manufacturing substrate illustrating a step of forming a second divider line on the manufacturing substrate.

Subsequently, as shown in FIGS. 6 and 7B, second divider lines L21 to L24 are formed in the blank region A2 by removing portions of the first lamination 11. The second divider lines LL21 to L24 are formed in the blank region A2 at positions that are not covered by the protective film 13. In this embodiment, the second divider line L21 is located off from the protective film 13 in the X1 direction, and extends to the first divider line L11. The second divider line L22 is located off from the protective film 13 in the X2 direction, and extends to the first divider line L12. The second divider line L23 is located off from the protective film 13 in the Y2 direction, and extends to the first divider line L13. The second divider line L24 is formed at substantially the same position as the first divider line L14.

The second divider lines L21 to L24 are formed by directly irradiating the first lamination 11 with laser beams without through the protective film 13. As such, the second divider lines L21 to L24 can be formed at the predetermined depth. That is, the second divider lines L21 to L24 can be formed without the remainder of the first lamination 11 in the Z-axis direction.

When the second divider lines L21 to L24 are formed as described above, the first lamination 11 is altered by heat of the laser beams, and thus a foreign substance D1 is generated. The foreign substance D1 accumulates on the first lamination 11 and the protective film 13.

[2-8. Cleaning Step]

Figure 7C:
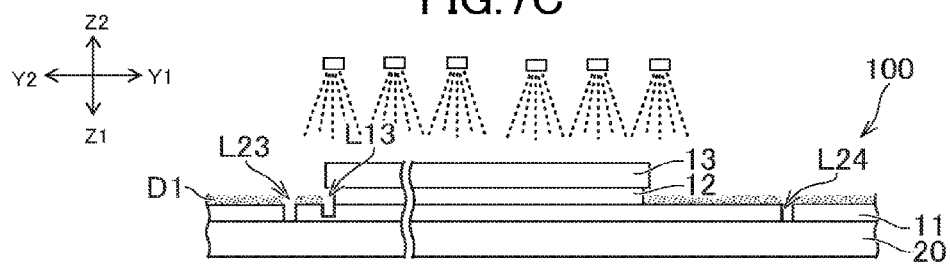
FIG. 7C is a cross-sectional view of the manufacturing substrate illustrating a step of cleaning the manufacturing substrate.

As shown in FIG. 7C, the manufacturing substrate 100 is cleaned, and the foreign substance D1 accumulated on the first lamination 11 and the protective film 13 is removed. The cleaning method may include spraying water or ethanol, or using air or ultrasonic vibrations. The foreign substance D1 is stuck to the surface of the first lamination 11, and thus, may not be removed from the first lamination 11 even after the cleaning. However, since the foreign substance D1 is not stuck to the protective film 13, the foreign substance D1 can be completely removed from the display area A11 to which the protective film 13 is adhered. That is, the protective film 13 is adhered before the second divider lines L21 to L24 are formed, and thus it is possible not to adversely affect the display of an image in the display area A11.

[2-9. Exposing Step]

Figure 7D:
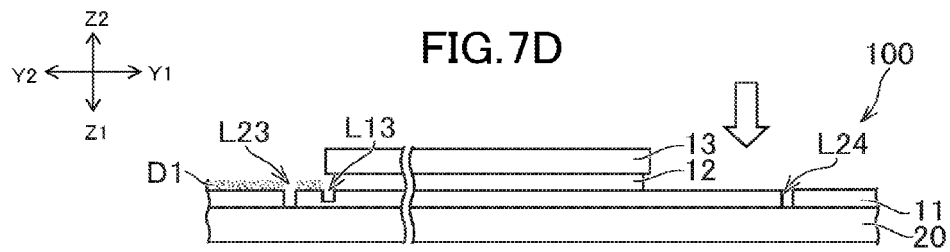
FIG. 7D is a cross-sectional view of the manufacturing substrate illustrating a step of exposing a wiring layer of the manufacturing substrate.

Next, as shown in FIG. 7D, the surface of the first lamination 11 is superficially removed in the first and second terminal areas A13 and A14 so that a wiring layer formed in the first lamination 11 are exposed on the surface. For example, the first lamination 11 may be superficially removed by a dry etching process using fluorine gas. In this step, after the wiring layer is exposed, the manufacturing substrate 100 may be cleaned again to remove the foreign substance generated in the dry etching process.

[2-10. First Cutting Step]

Figure 8:
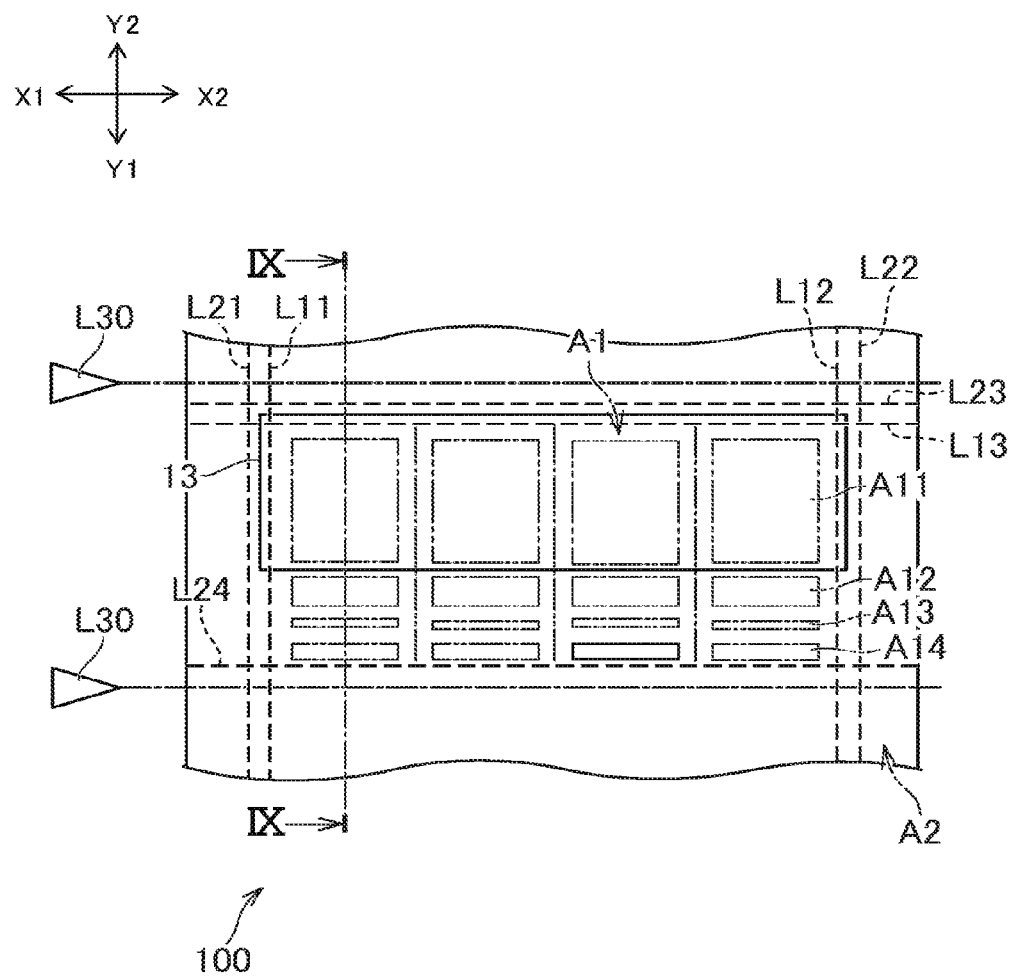
FIG. 8 is a top view of the manufacturing substrate illustrating a step of cutting the manufacturing substrate so as to include a group of product regions.
Figure 9A:
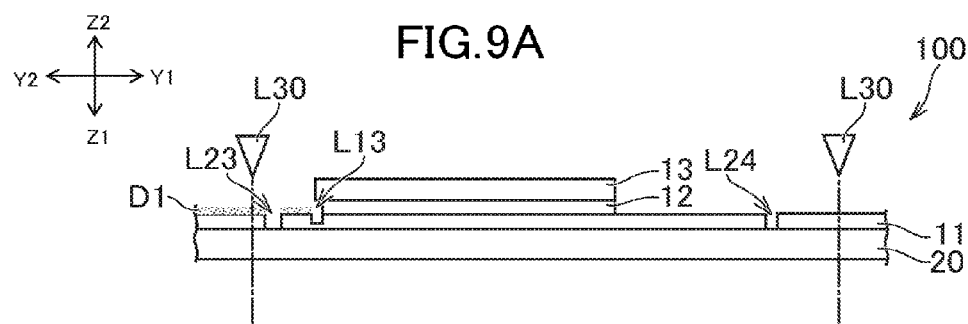
FIG. 9A is a cross-sectional view of the manufacturing substrate so as to include a group of product regions.

Subsequently, as shown in FIGS. 8 and 9A, the first lamination 11 is cut at a position that is located in an area surrounded by the second divider lines L21 to L24 and does not overlap the area including the product region A1 in order to cut out the group of product regions A1 including the display areas A11. In this embodiment, the manufacturing substrate 100 is cut out along the cutting line L30 in the blank region A2 with a mechanical cutter, for example. In this embodiment, the group of product regions A1 is arranged along the Y-axis direction, and thus the cutting line L30 crosses the manufacturing substrate 100 in the X-axis direction.

[2-11. Protective Film Adhering Step]

Figure 9B:
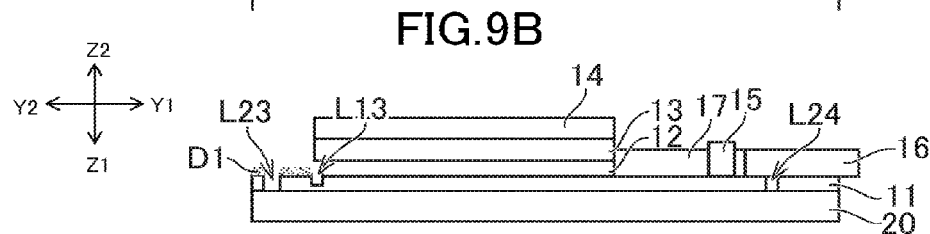
FIG. 9B is a cross-sectional view of the manufacturing substrate illustrating a step of attaching a polarizing plate and an IC to the manufacturing substrate.

As shown in FIG. 9B, a polarizing plate 14 is then adhered to the protective film 13. The polarizing plate 14 covers the plurality of display areas A11. In this embodiment, similarly to the protective film 13, the polarizing plate 14 covers a part of the blank region A2 across the boundary of the group of product regions A1, and does not cover the curved area A12, the first terminal area A13, and the second terminal area A14.

[2-12. Attaching Step]

Subsequently, as shown in FIG. 9B, the IC 15 is attached to the first terminal area A13, and the FPC 16 is attached to the second terminal area A14. The IC 15 and the FPC 16 are attached by means of a conductive material, such as soldering, and electrically connected to the wiring layer included in the first lamination 11. The IC 15 may be attached to the FPC 16. The resin layer 17 is formed so as to cover peripheries of the curved area A14 and the first and second terminal areas A13 and A14.

[2-13. Second Irradiating Step]

Figure 9C:
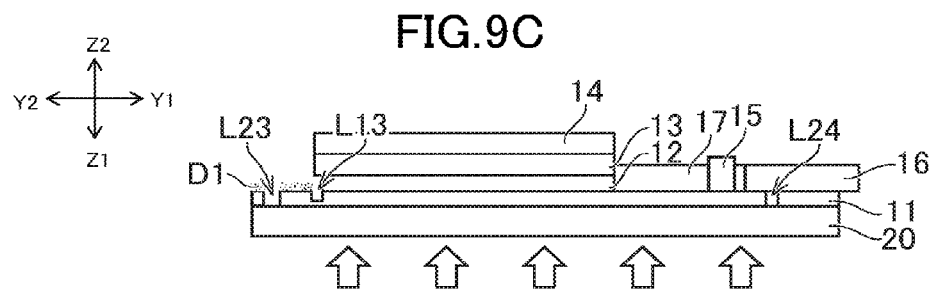
FIG. 9C is a cross-sectional view of the manufacturing substrate illustrating a step of irradiating the manufacturing substrate with laser beams.

As shown in FIG. 9C, laser beams are irradiated to the substrate 20 on the side that is not in contact with the sheet substrate included in the first lamination 11. This reduces the adhesion between the substrate 20 and the sheet substrate stuck to the substrate 20, and thus the substrate 20 can be removed from the sheet substrate.

In the blank region A2, adhesion between the substrate 20 and the sheet substrate may be maintained in an area outside the area bounded by the second divider lines L21 to L24. As such, laser beams may be irradiated such that at least the area bounded by the second divider line L21 to L24 is thoroughly irradiated. The laser beams are not diffused in the area bounded by the second divider lines L21 to L24 and in the vicinity of the cut end of the substrate 20, and thus, it is possible not to maintain the adhesion between the substrate 20 and the sheet substrate in such areas.

[2-14. Second Removing Step]

Figure 9D:
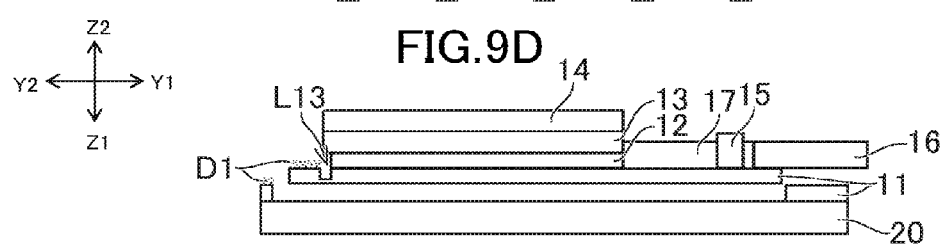
FIG. 9D is a cross-sectional view of the manufacturing substrate illustrating a step of removing the substrate from the manufacturing substrate.

Subsequently, as shown in FIG. 9D, the substrate 20 is removed from the sheet substrate included in the first lamination 11. As described above, the second divider lines L21 to L24 are formed on the first lamination 11, and the adhesion between the substrate 20 and the sheet substrate is reduced in an area bounded by the second divider lines L21 to L24 and containing the group of product regions A1. This configuration enables to remove the substrate 20 without damaging the sheet substrate. In an area outside the area bounded by the second divider lines L21 to L24, an area of the first lamination 11 unnecessary for a product is removed together with the substrate 20. If the adhesion between the substrate 20 and the sheet substrate is maintained in the area outside the area bounded by the second divider lines L11 to L14, the first lamination 11 in the outside area is removed from the manufacturing substrate 100 together with the substrate 20.

[2-15. Backing Film Adhering Step]

Figure 9E:
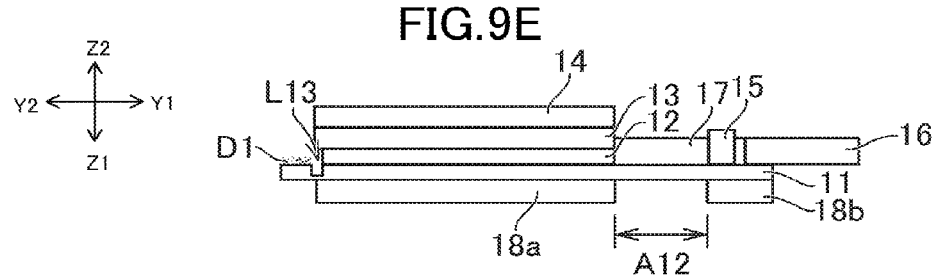
FIG. 9E is a cross-sectional view of the manufacturing substrate illustrating a step of adhering a backing film to the manufacturing substrate.

Next, as shown in FIG. 9E, backing films 18a and 18b are adhered to the bottom of the first lamination 11 (in the Z1 direction side). In the later steps, the backing films 18a and 18b are preferably adhered to a position clear of the curved area A12 in order to reduce the resistance to the display device 1 when the display device is bent.

[2-16. Autoclaving Step]

Subsequently, autoclaving is performed to apply heat and pressure to the manufacturing substrate 100. This removes air bubbles between the protective film 13 and the counter sheet substrate and air bubbles between the sheet substrate and the backing films 18a and 18b.

[2-17. Second Cutting Step]

Figure 10:
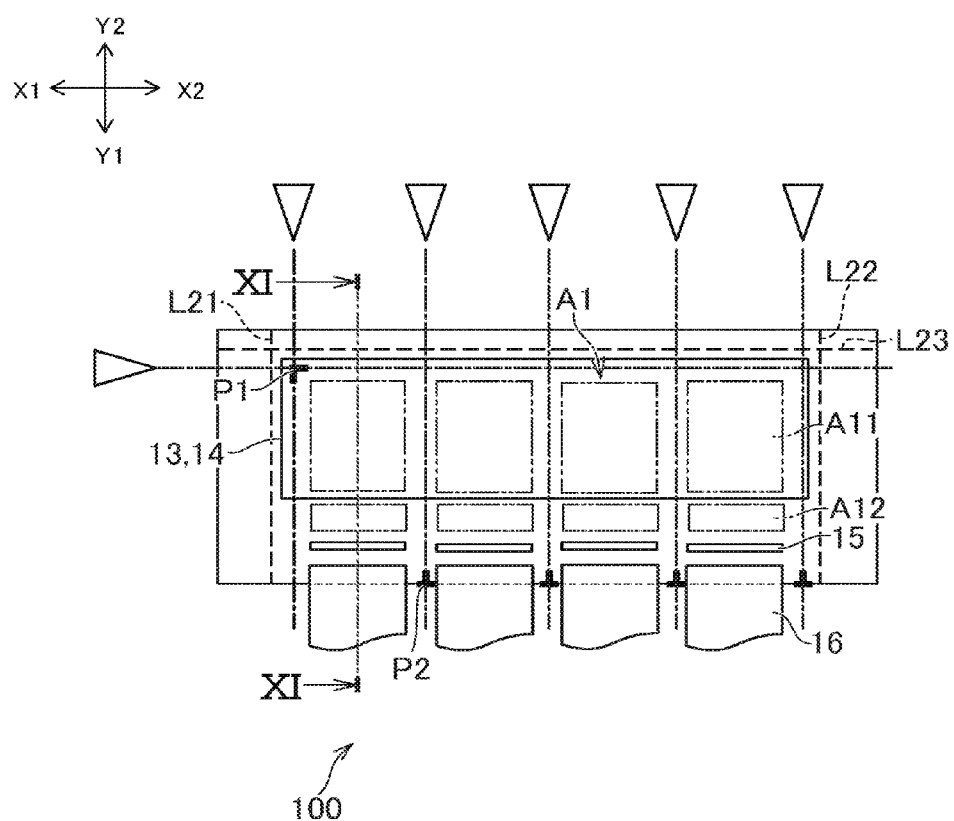
FIG. 10 is a top view of the manufacturing substrate illustrating a step of cutting the manufacturing substrate for individual product regions.
Figure 11:
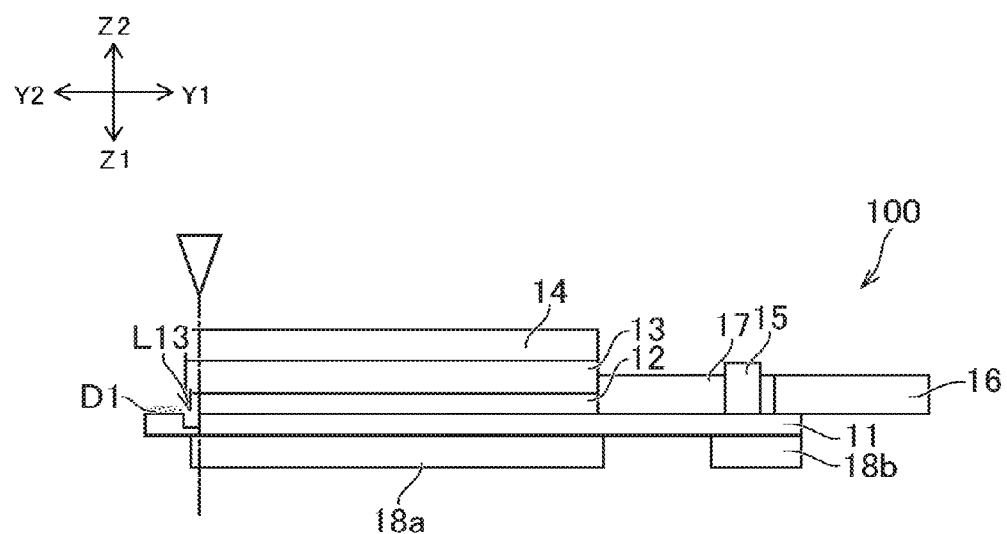
FIG. 11 is a cross-sectional view illustrating a step of cutting the manufacturing substrate for individual product regions.

As shown in FIGS. 10 and 11, the first and second laminations 11 and 12 are cut at the boundaries of the product regions A1 in order to cut out individual products. In this embodiment, alignment marks P1 and P2 are provided on the boundary of the product region A1 as marks for cutting, and the manufacturing substrate 100 is cut such that the cutting lines overlap the alignment marks P1 and P2. The alignment marks P1 and P2 may be formed so as to overlap opposing vertexes of the product regions A1. The alignment marks P2 are preferably provided to respective product regions A, although one alignment mark P1 may be provided to each group of product regions A1.

As described above, the protective film 13 covers the product region A1 in the X1 direction, the X2 direction, and the Y2 direction. The manufacturing substrate 100 is cut along the boundary of the product region A1, and the foreign substance D1 remaining on the first lamination 11 is thereby cut off from the display device 1 in the X1 direction, the X2 direction, and the Y2 direction of the protective film 13.

[2-18. Curving Step]

Finally, as shown in FIG. 1, the curved area A2 of the display device 1 is curved along the spacer 19 to form the display device 1 as a final product. As shown in FIG. 11, it is possible to reduce the resistance generated when the display device 1 is curved in the curved area A2 by not providing the protective film 13, the polarizing plate 14, and the backing films 18a and 18b to the curved area A2 of the display device 1 or reducing the area to which the protective film 13, the polarizing plate 14, and the backing films 18a and 18b are adhered. Further, this configuration can also prevent cracks of the protective film 13, the polarizing plate 14, and the backing films 18a and 18b.

As described above, in the manufacturing process of the display device 1 according to this embodiment, the protective film 13 is adhered to the first lamination 11 including the sheet substrate, and then the second divider lines L21 to L24 are formed on the first lamination 11. This configuration can prevent the sheet substrate from being damaged when the substrate 20 is removed. When the second divider lines L21 to L24 are formed, the first lamination 11 is altered by heat of laser beams and a foreign substance D1 is thereby generated, but the foreign substance D1 accumulated on the protective film 13 can be removed by cleaning. Further, since the protective film 13 is adhered so as to cover the product regions A1, the display device 1 can be manufactured more easily as compared to the case where the protective films are respectively adhered to the product regions A1.

[3. Variations]

The present invention is not limited to the above described embodiment and may be modified in various manners. In the following, examples of other manners (variations) in which the present invention is implemented will be discussed.

[3-1. First Variation]

Figure 12:
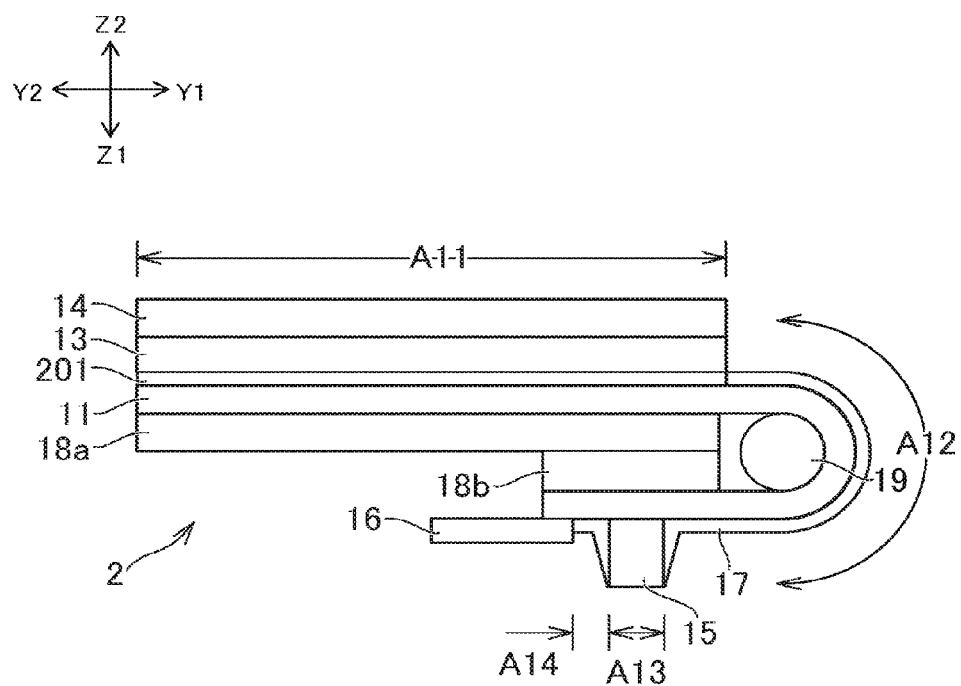
FIG. 12 is a schematic cross-sectional view of the display device according to a first variation.

FIG. 12 is a cross-sectional view of a display device 2 according to the first variation, and FIGS. 13 to 16 are diagrams explaining manufacturing process of the display device 2. As shown in FIG. 2, the display device 2 according to this variation is different from the display device 1 described in the embodiment in that the second lamination 12 is not formed but a sealing layer 201 is formed. In this variation, a display element layer included in the first lamination 11 is configured to emit light in a plurality of colors.

The sealing layer 201 seals the display element layer included in the first lamination 11 and prevents moisture ingress to the display element layer, for example. The sealing layer 201 is formed on the first lamination 11, and covers at least the display area A1. The sealing layer 201 may be formed to include an inorganic material, such as silicon oxide and silicon nitride, or formed by laminating a film of an inorganic material and a film of an organic material.

Figure 13A:
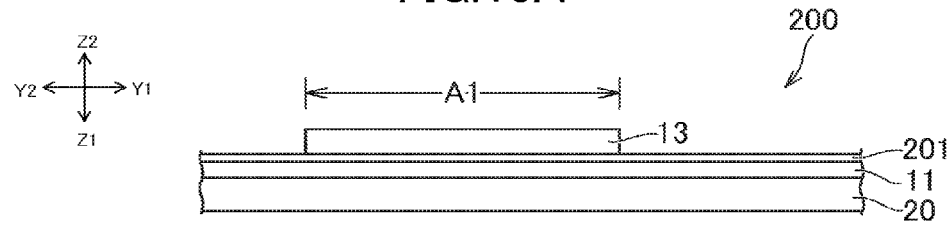
FIG. 13A is a cross-sectional view of the manufacturing substrate illustrating a step of adhering a protective film to the manufacturing substrate.

The manufacturing method of the display device 2 according to this variation will be discussed below. As shown in FIG. 13A, a manufacturing substrate 200, on which a plurality of display devices 2 are formed, is prepared. The manufacturing substrate 200 includes a substrate 20 and a first lamination 11 described in the embodiment. A sheet substrate formed on the first lamination 11 is stuck to the substrate 20. The manufacturing substrate 200 includes a plurality of product regions A1 and a blank region A2 surrounding the product regions A1 as described in the embodiment. Each product region A1 includes display areas A11, a curved area A12, a first terminal area A13, and a second terminal area A14. A sealing layer 201 is formed on the manufacturing substrate 200. The sealing layer 201 is formed on the first lamination 11, and covers at least the display area A11.

Figure 14:
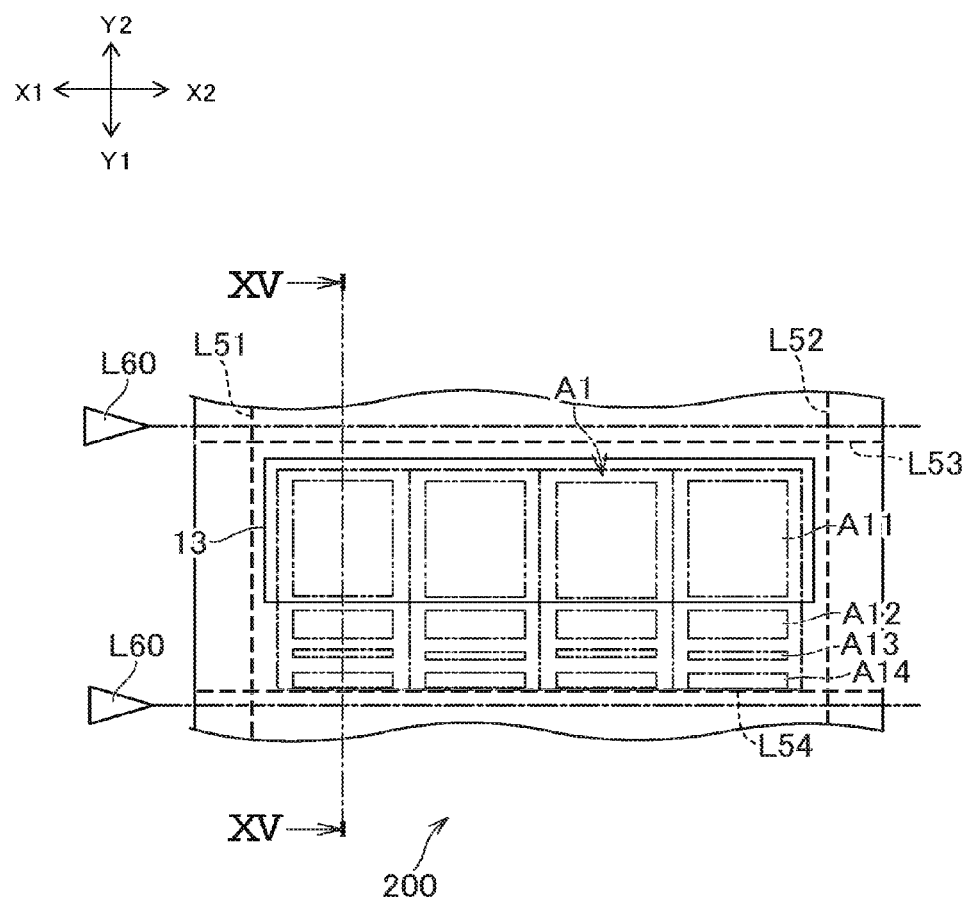
FIG. 14 is a top view of the manufacturing substrate illustrating a step of cutting the manufacturing substrate so as to include a group of product regions.

Subsequently, as shown in FIGS. 13A and 14, a protective film 13 is adhered to the sealing layer 201. Similarly to the embodiment, the protective film 13 is adhered so as to cover the display areas A11 and a part of the blank region A2. The protective film 13 does not cover the curved area 12, the first terminal area A13, and the second terminal area A14.

Figure 13B:
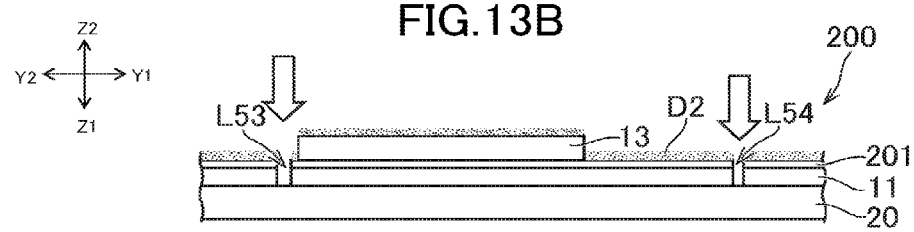
FIG. 13B is a cross-sectional view of the manufacturing substrate illustrating a step of forming a divider line on the manufacturing substrate.

As shown in FIGS. 13B and 14, divider lines L51 to L54 are formed by linearly removing portions of the sealing layer 201 and the first lamination 11 at positions in the blank region A2 that are not covered by the protective film 13. The divider lines L51 to L54 are formed at substantially the same positions as the second divider line L21 to L24 (see FIG. 8) described in the embodiment. As shown in FIG. 14, the divider line L51 is positioned in the X1 direction side of the protective film 13 and extends in the Y-axis direction. The divider line L52 is positioned in the X2 direction side of the protective film 13 and extends in the Y-axis direction. The divider line L53 is positioned in the Y2 direction side of the protective film 13 and extends in the X-axis direction. The divider line L54 is formed at substantially the same position as the boundary of the product region A1 in the Y1 direction side.

Figure 13C:
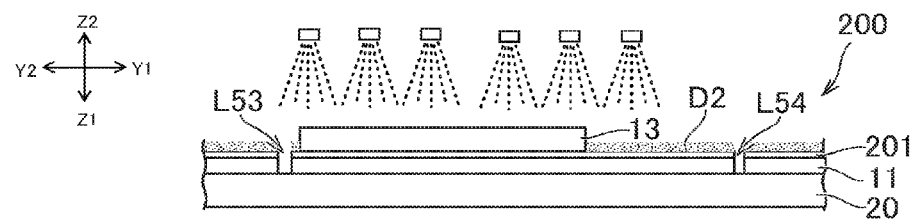
FIG. 13C is a cross-sectional view of the manufacturing substrate illustrating a step of cleaning the manufacturing substrate.
Figure 13D:
FIG. 13D is a cross-sectional view of the manufacturing substrate illustrating a step of exposing a wiring layer of the manufacturing substrate.

The divider lines L51 to L54 are formed by directly irradiating laser beams to the sealing layer 201 and the first lamination 11. At this time, the sealing layer 201 and the first lamination 11 are altered by heat of laser beams, and a foreign substance D2 is thus generated. The foreign substance D2 is accumulated on the sealing layer 201 and the protective film 13. Subsequently, as shown in FIG. 13C, the manufacturing substrate 200 is cleaned using water, for example, to remove the foreign substance D2 accumulated on the sealing layer 201 and the protective film 13. As shown in FIG. 13D, the first lamination 11 is superficially removed in the first and second terminal areas A13 and A14 by the dry etching process using etching gas so that a wiring layer included in the first lamination 11 is exposed. Subsequently, the manufacturing substrate 200 may be cleaned once again to remove a foreign substance generated in the dry etching process.

Figure 15A:
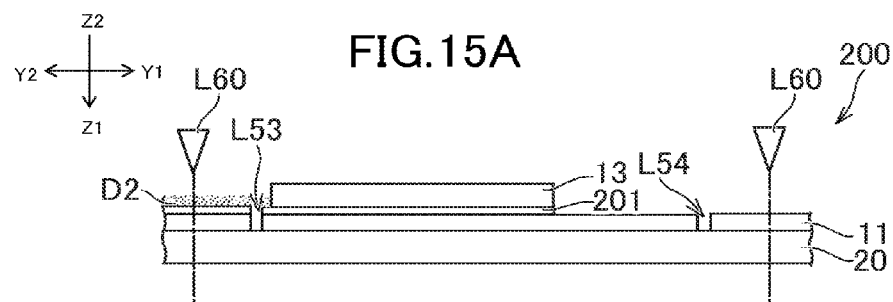
FIG. 15A is a cross-sectional view of the manufacturing substrate illustrating a step of cutting the manufacturing substrate so as to include a group of product regions.

As shown in FIG. 14 and FIG. 15A, the manufacturing substrate 200 is cut in a size including a group of product regions A1. More specifically, the first lamination 11 is cut at a position that does not overlap the area surrounded by the divider lines L51 to L54 and including the group of product regions A1. In this variation, the manufacturing substrate 200 is cut along a cutting line L60 extending across the manufacturing substrate 200 in the blank region.

Figure 15B:
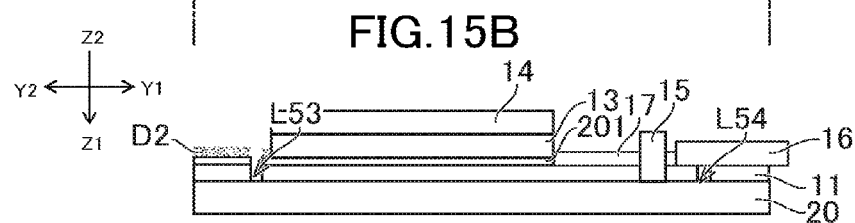
FIG. 15B is a cross-sectional view of the manufacturing substrate illustrating a step of attaching a polarizing plate and an IC to the manufacturing substrate.

As shown in FIG. 15B, a polarizing plate 14 is then adhered to the protective film 13. An IC 15 is attached to the first terminal area A13, and an FPC 16 is attached to the second terminal area A14. The IC 15 may be attached to the FPC 16. Further, a resin layer 17 is formed so as to cover peripheries of the curved area A14 and the first and second terminal areas A13 and A14.

Figure 15C:
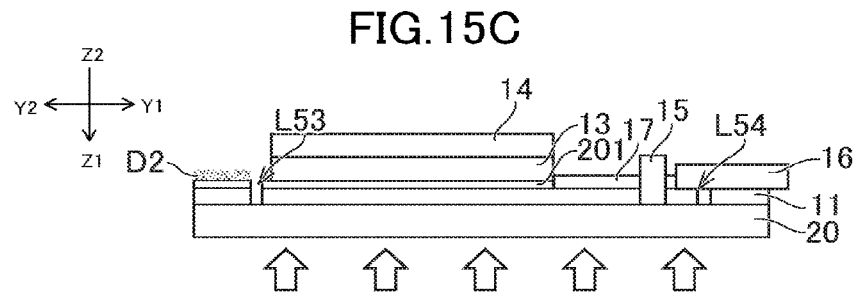
FIG. 15C is a cross-sectional view of the manufacturing substrate illustrating a step of irradiating the manufacturing substrate with laser beams.
Figure 15D:
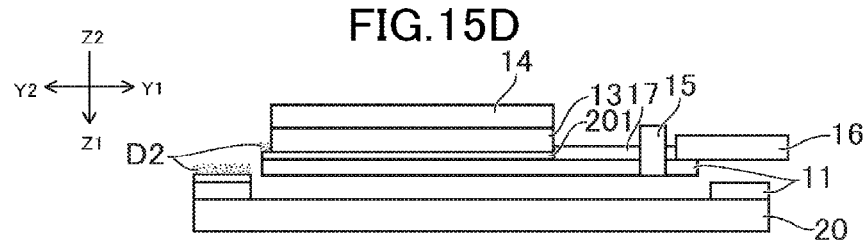
FIG. 15D is a cross-sectional view of the manufacturing substrate illustrating a step of removing the substrate from the manufacturing substrate.
Figure 15E:
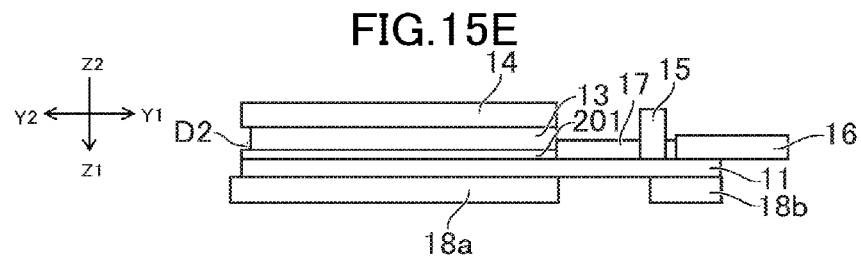
FIG. 15E is a cross-sectional view of the manufacturing substrate illustrating a step of adhering a backing film to the manufacturing substrate.

Subsequently, as shown in FIG. 15C, laser beams are irradiated to the substrate 20 on the side that is not in contact with the sheet substrate included in the first lamination 11. As shown in FIG. 15D, the substrate 20 is then removed from the sheet substrate included in the first lamination 11. As described above, the divider lines L51 to L54 are formed on the first lamination 11. The laser irradiation reduces the adhesion between the substrate 20 and the sheet substrate in the area surrounded by the divider lines L51 to L54, and thus the sheet substrate can be removed from the substrate 20 without damaging the sheet substrate. As shown in FIG. 15E, backing films 18a and 18b are adhered to the bottom of the first lamination 11.

Figure 16:
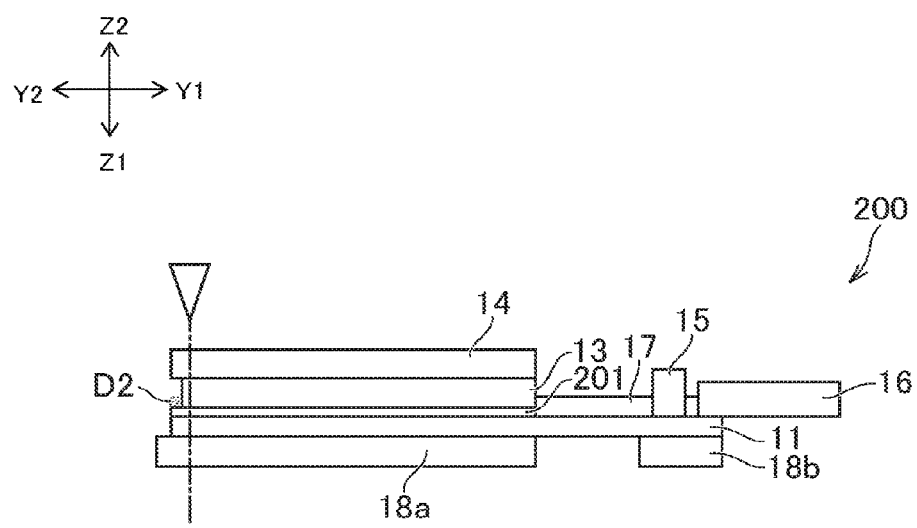
FIG. 16 is a cross-sectional view of the manufacturing substrate illustrating a step of cutting the manufacturing substrate for individual product regions.

Subsequently, as shown in FIG. 16, the manufacturing substrate 200 is cut along the boundaries of the product regions A1 to cut out individual display devices 2. Finally, as shown in FIG. 1, the curved area A12 of the display device 2 is curved along the spacer 19 to form the display device 2 as a final product.

As described, in the manufacturing process of the display device 2 according to this variation as well, forming the divider lines L51 to L54 can prevent the sheet substrate from being damaged when the substrate 20 is removed. Although the foreign substance D2 is generated when the divider lines L51 to L54 are formed, the foreign substance D2 is not stuck to the protective film 13, and thus the foreign substance D2 accumulated on the protective film 13 can be removed by cleaning. Further, since one protective film 13 is adhered so as to cover each group of product regions A1, a display device 2 can be manufactured more easily as compared to the case where the protective films are respectively adhered to the product regions A1.

[3-2. Second Variation]

In the embodiment, the case is explained where a divider line, which is a portion formed by linearly removing the first lamination 11, is formed by laser beams, but the present invention is not to be limited to this. For example, a divider line may be formed on the first lamination 11 by blast treatment, that is, by being collided against granular substances.

Figure 17:
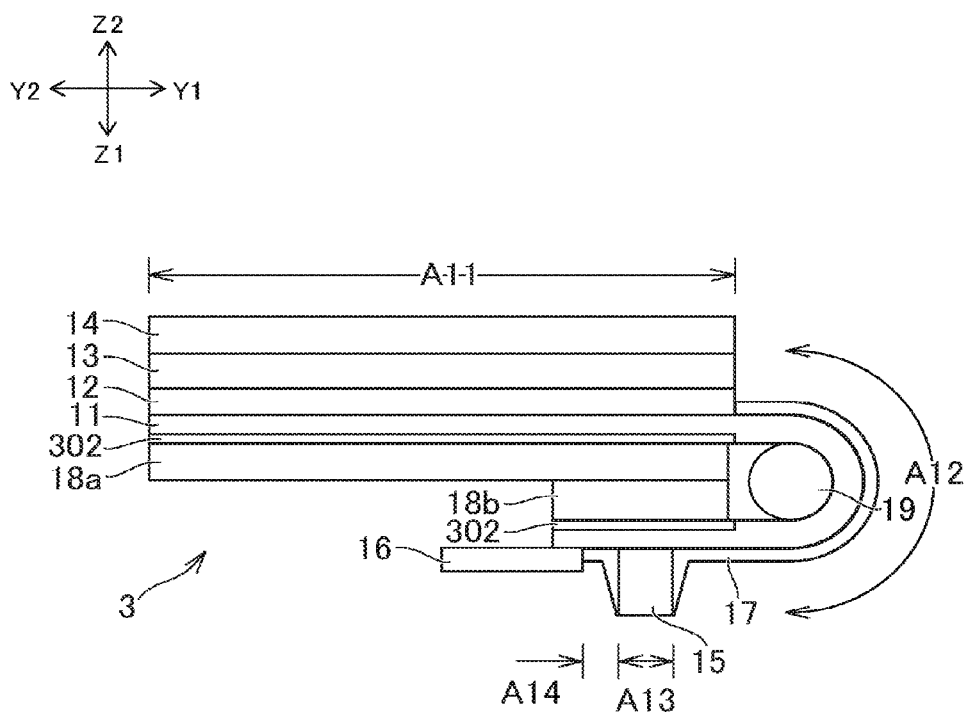
FIG. 17 is a schematic cross-sectional view of the display device according to a second variation.
Figure 18:
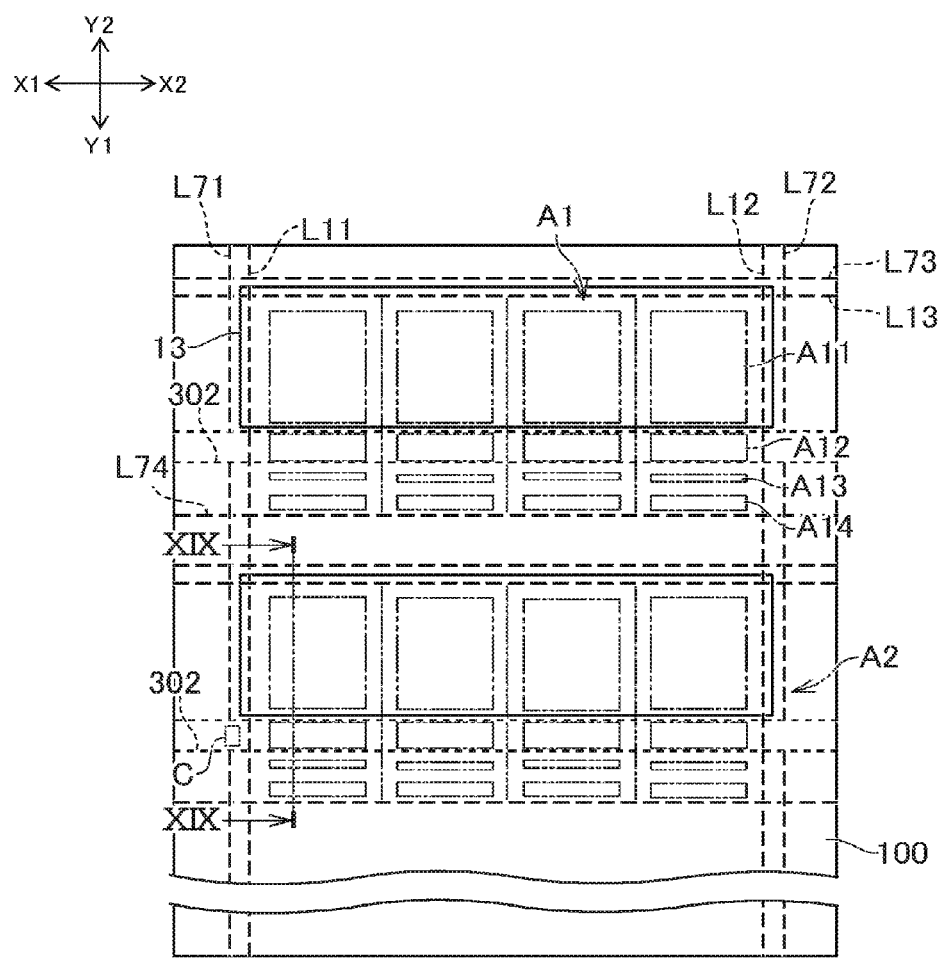
FIG. 18 is a top view of the display device illustrating a step of forming a divider line in the method for manufacturing the display device.
Figure 19:
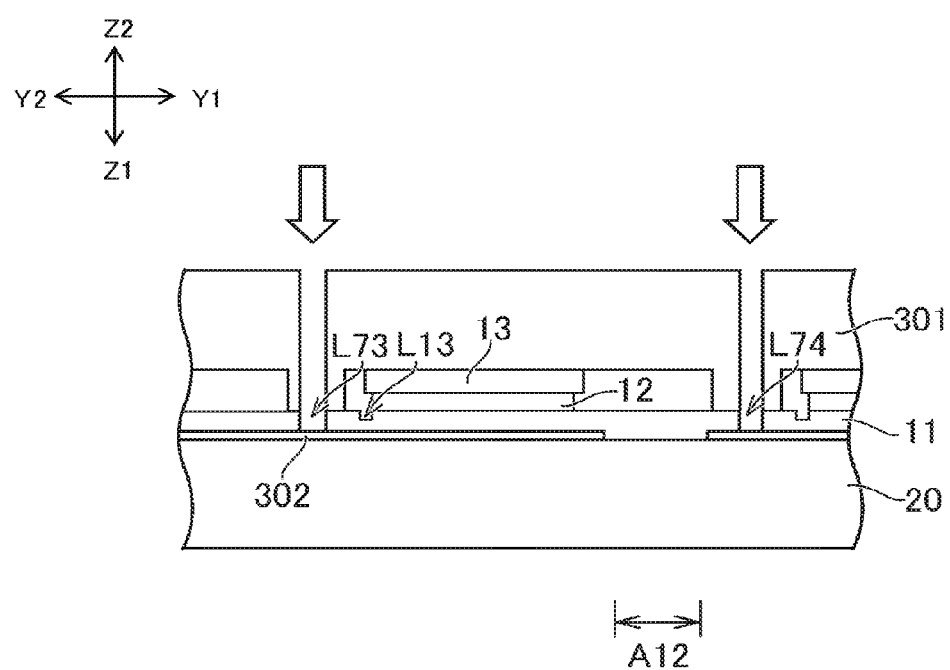
FIG. 19 is a cross-sectional view of the display device illustrating a step of forming a divider line in the method for manufacturing the display device.

FIG. 17 is a cross-sectional view of a display device 3 according to the second variation. FIGS. 18 to 19 are diagrams for explaining steps of forming second divider lines L71 to L74 in the manufacturing process of the display device 3. As shown in FIG. 17, a protective film 302 is formed on the display device 3 according to this variation. Further, as shown in FIG. 18, the protective film 302 is formed at a position that does not overlap the curved area A12 in a plan view. In this variation, the protective film 302 covers from the edge of the curved area A12 in the Y1 direction side of the product region A1 to the blank region A2 in the Y1 direction side, and further to the edge of the curved area A12, which is positioned in the Y1 direction side, in the Y2 direction side. The protective film 302 is formed so as to cover from the edge of the manufacturing substrate 100 in the X1 direction side to the edge of the manufacturing substrate 100 in the X2 direction side.

As shown in FIG. 19, when the divider lines L71 to L74 are formed on the first lamination 11 by the blast treatment, a mask substrate 301 is disposed on the first lamination 11, the second lamination 12, and the protective film 13. The mask substrate 301 is made of a hard material so that cracks and deformation do not occur due to the blast treatment, and through holes are formed in the Z-axis direction at positions where the divider lines L71 to L74 are formed. When the divider lines L71 to L74 are formed by blast treatment similarly to this variation, a foreign substance attached to the surfaces of the first and second laminations 11 and 12 may be removed by superficially removing the first and second laminations 11 and 12. In this case, the mask substrate 301 may be disposed before the protective film 13 is adhered, and then the blast treatment may be performed.

In this variation, the protective film 302 is formed between the first lamination 11 and the substrate 20 in order to prevent the substrate 20 from being cracked by the blast treatment. Materials of the protective film 302 include, for example, diamond-like carbon (DLC), alumina, and silicon carbide. As described above, the protective film 302 is formed at the position that does not overlap the curved area A12. This configuration enables to curve the display device 3 at the curved area A12.

In this variation, the divider lines L71 and L72 extending in the Y-axis direction are disconnected in the area C on which the protective film 302 is not disposed. In this case as well, the substrate 20 can be removed without damaging the first lamination 11 by making notches along the divider lines L71 and L72 in the area C with a mechanical cutter, for example.

Figure 20:
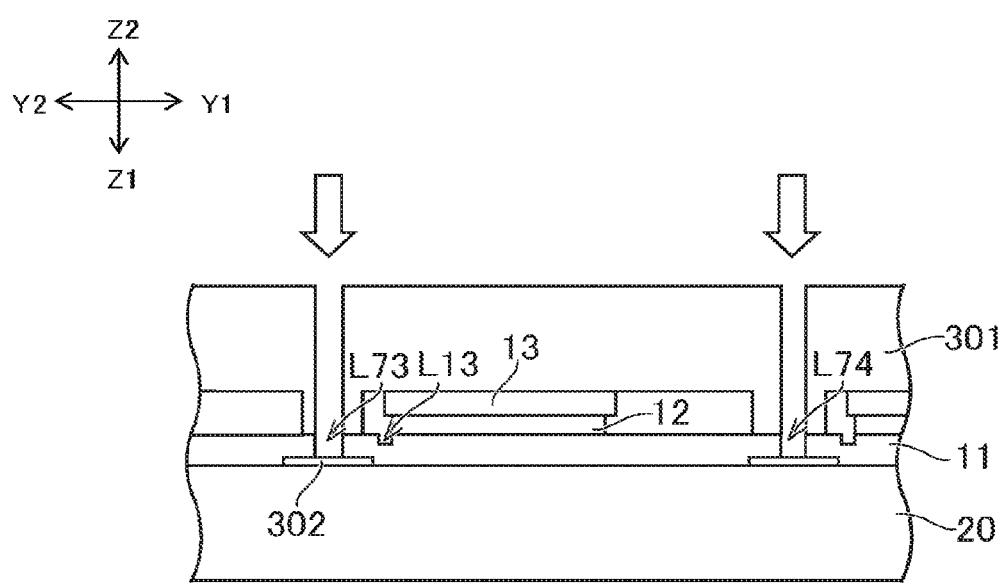
FIG. 20 is a cross-sectional view of the display device according to another variation illustrating a step of forming a divider line in the method for manufacturing the display device.

The protective film 302 may not necessarily be formed on the entire manufacturing substrate 100 other than the curved area A12. For example, as shown in FIG. 20, the protective film 302 may be limited to being formed at the position that overlaps the divider lines L71 to L74 in the Z-axis direction.

[3-3. Third Variation]

In the embodiment, the groups of product regions A1, which are adjacent to one another, are arranged at intervals in the Y-axis direction, a protective film 13 is adhered to each group of product regions A1, and the manufacturing substrate is cut for each group of product regions A1. The positions to dispose the groups of product regions A1 in the manufacturing substrate may be changed appropriately.

Figure 21:
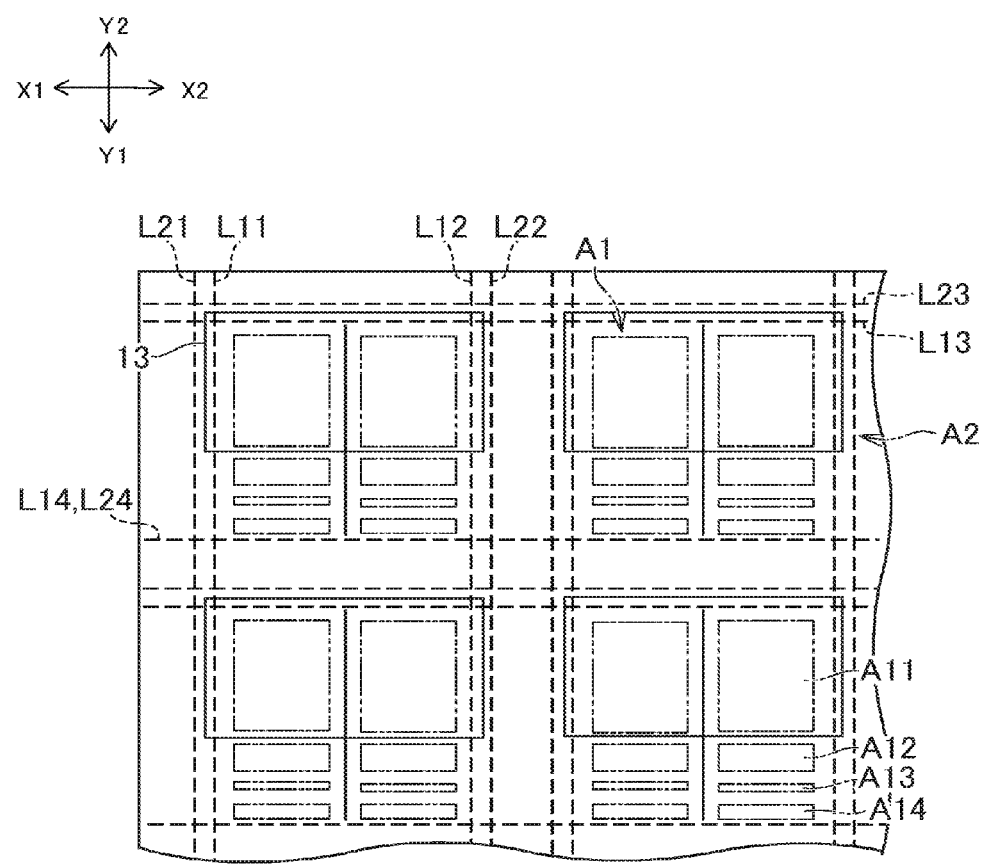
FIG. 21 is a top view of the manufacturing substrate according to a third variation.

For example, as shown in FIG. 21, a group of product regions A1 may be disposed away from another group of product regions A1 in the X-axis direction. In this case, similarly to the manufacturing method described in the embodiment, display devices may be cut individually by adhering a protective film 13 to each group of product regions A1, forming the second divider lines L21 to L24 so as not to overlap the protective films 13 and the groups of product regions A1, removing the substrate, and cutting the manufacturing substrate at boundaries of the product regions A1. In this variation as well, a protective film 13 may be adhered to each group of product regions A1, a display device can be manufactured more easily as compared to the case where the protective films are respectively adhered to all of the product regions A1 included in the manufacturing substrate.

[3-4. Fourth Variation]

In the embodiment, the plurality of product regions A1 are arranged adjacent to one another along the X-axis to form the groups of product regions A1, and the protective film 13 is adhered so as to cover the plurality of display areas A11 respectively provided to the product regions A1, although the product regions A1 in the groups of product regions A1 are not necessarily adjacent to one another.

Figure 22:
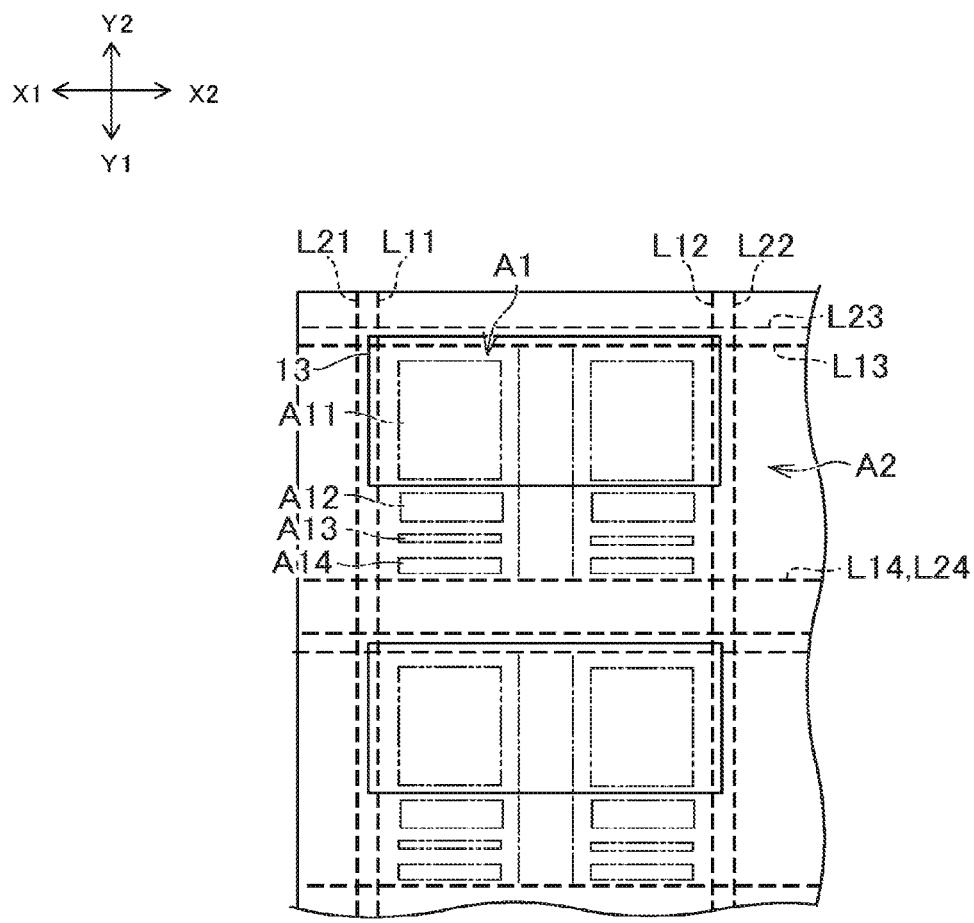
FIG. 22 is a top view of the manufacturing substrate according to a fourth variation

For example, as shown in FIG. 22, the product regions A1 in the groups of product regions A1 may be disposed away from each other in the X-axis direction. In this case as well, the display devices can be cut individually by adhering a protective film 13 to each group of product regions A1 and then cutting the manufacturing substrate at respective boundaries of product regions A1.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A method for manufacturing a display device, comprising:
   a preparing step of preparing a lamination that includes a sheet substrate and a display element layer, the sheet substrate including a plurality of product regions cut out into a plurality of products and a blank region surrounding the product regions, the display element layer formed on each of a plurality of display areas placed on each of the plurality of product regions for displaying an image, the sheet substrate being adhere to a top of a substrate, and the substrate having light transmissivity;
   an adhering step of adhering a protective film on the lamination so as to cover the display areas;
   a dividing step of forming, after the adhering step, a divider line by removing a portion of the blank region of the lamination;
   an irradiating step of irradiating, after the dividing step, the sheet substrate with a laser beam from a side of the substrate that is not in contact with the sheet substrate; and
   a removing step of removing the substrate from the sheet substrate after the irradiating step.

2. The method for manufacturing the display device according to claim 1, wherein
   the protective film covers a part of the blank region and the display areas, and
   the divider line is formed in the blank region at a position that is not covered by the protective film.

3. The method for manufacturing the display device according to claim 1, wherein
   the product regions respectively include each of a plurality of terminal areas at positions that do not overlap the display areas,
   the display areas are disposed adjacent to one another such that the terminal areas are not placed between the display areas, and
   the protective film covers the display areas and does not cover the terminal areas respectively included in the product regions.

4. The method for manufacturing the display device according to claim 3, wherein
   the product regions are arranged adjacent to one another in a direction in which the display areas are arranged.

5. The method for manufacturing the display device according to claim 1, further comprising a cutting step of cutting, after the removing step, the lamination at boundaries of the product regions to cut out individual products.

6. The method for manufacturing the display device according to claim 1, wherein
   A counter substrate and a counter sheet substrate are formed on the lamination, the counter sheet substrate being stuck to the counter substrate, and
   the method for manufacturing the display device further includes:
      a second removing step of removing, before the adhering step, the counter substrate from the counter sheet substrate;
      a second irradiating step of irradiating, before the second removing step, the counter sheet substrate with a laser beam from the counter substrate on a side with which the counter sheet substrate is not in contact; and a second dividing step of forming, before the second irradiating step, a divider line by removing a portion of the counter sheet substrate at a position that does not overlap the product regions.

* * * * *